United States Patent
Dobrovolny

[19]

[11] Patent Number: 5,917,386
[45] Date of Patent: Jun. 29, 1999

[54] PRINTED CIRCUIT TRANSFORMER HYBRIDS FOR RF MIXERS

[75] Inventor: Pierre Dobrovolny, North Riverside, Ill.

[73] Assignee: Zenith Electronics Corporation, Glenview, Ill.

[21] Appl. No.: 08/815,561

[22] Filed: Mar. 12, 1997

[51] Int. Cl.⁶ .................. H04B 3/03; H03H 7/48
[52] U.S. Cl. .............. 333/119; 333/25; 455/327; 455/330
[58] Field of Search ................. 333/25, 117, 118, 333/119, 120; 455/323, 326, 327, 330

[56] References Cited

U.S. PATENT DOCUMENTS

| | | | |
|---|---|---|---|
| 4,992,769 | 2/1991 | Oppelt | 333/25 |
| 5,307,518 | 4/1994 | Maeda et al. | 455/326 |
| 5,650,756 | 7/1997 | Hayashi | 333/118 X |

*Primary Examiner*—Robert Pascal
*Assistant Examiner*—Justin P. Bettendorf

[57] ABSTRACT

A high frequency partial transformer hybrid includes a first divided circular conductive element affixed to one side of an insulated substrate and a second split circular conductive element affixed to the other side of the substrate juxtaposed to the first element. Plated-through holes in the substrate interconnect pads on the first and second elements. Connection tabs on the elements are adapted to be connected to conductors on a printed circuit board when the substrate is orthogonally supported in a rectangular recess in the substrate. In a transformer hybrid embodiment, a third continuous circular conductive element is supported on an additional substrate in alignment with and insulated from the second element. The third element also includes connection tabs that are connectable to the conductors on the printed circuit board.

6 Claims, 2 Drawing Sheets

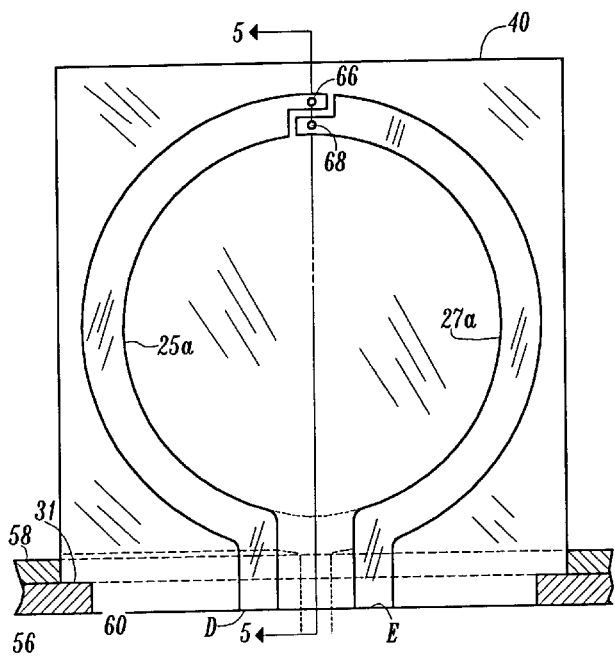
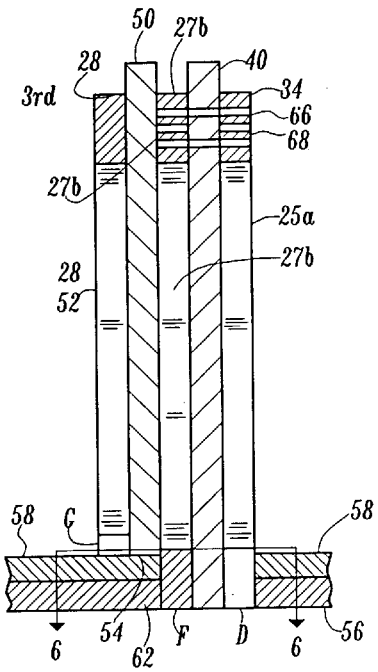
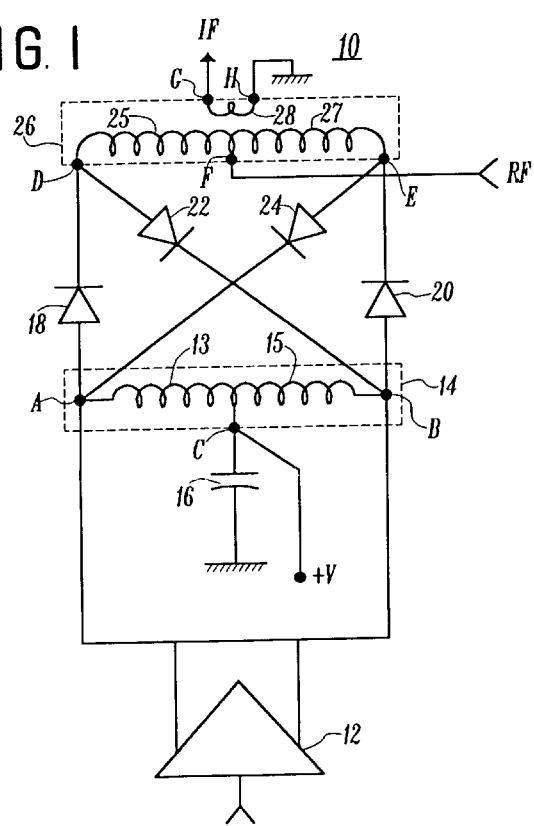
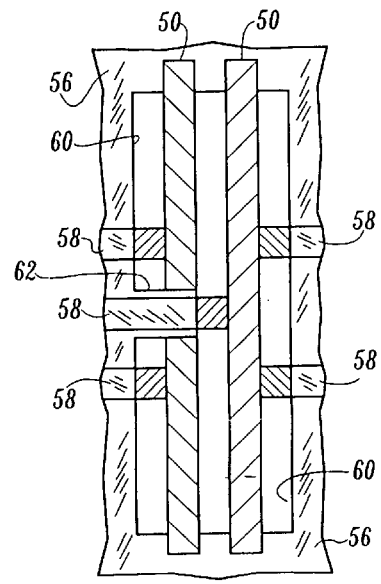

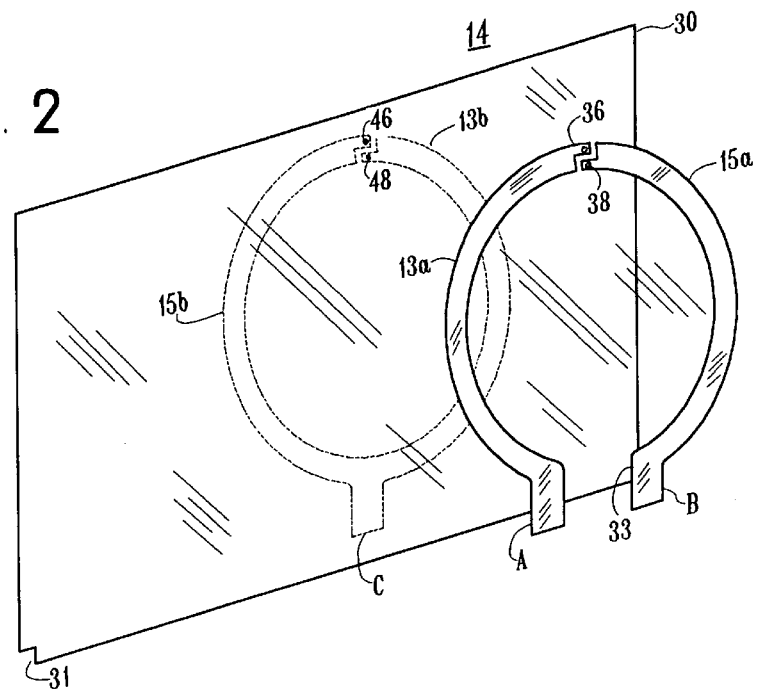
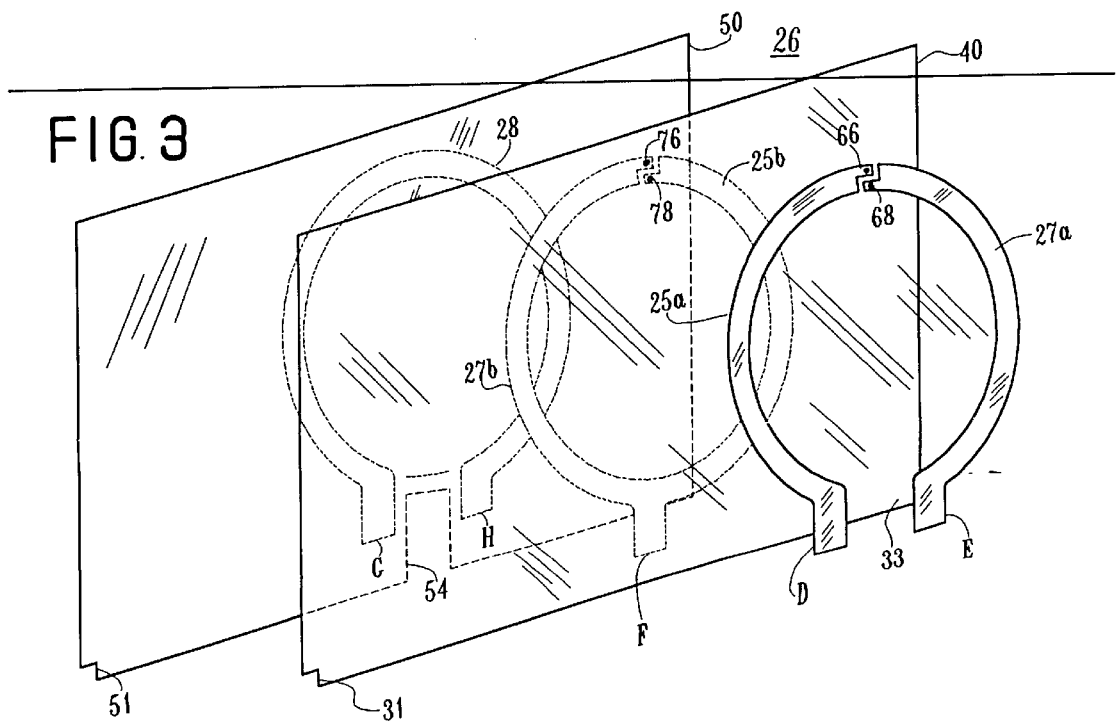

PRINTED CIRCUIT TRANSFORMER HYBRIDS FOR RF MIXERS

BACKGROUND OF THE INVENTION AND PRIOR ART

This invention relates to transformer hybrids and partial transformer hybrids used in RF mixers and especially to such devices in broadband RF mixers (used in television and satellite receivers) that operate up into the gigaHertz range of frequencies. As is well known, operations at such frequencies make component configurations, circuit layout, lead lengths and placement extremely critical. This is one of the reasons conventional ferrite core type coils and transformer hybrids are difficult to use in high frequency broadband RF mixer circuits. Another reason is the loss associated with the ferrite material. The present invention utilizes a construction technique that produces precisely controlled transformer hybrid and partial transformer hybrid configurations, minimizes lead length problems, reduces losses and avoids much costly and time consuming labor.

OBJECTS OF THE INVENTION

A principal object of the invention is to provide novel printed circuit transformer hybrid and partial transformer hybrid constructions.

A further object of the invention is to provide printed circuit high frequency transformer hybrid and partial transformer hybrid constructions.

Another object of the invention is to provide an improved broadband RF mixer for operations up into gigaHertz frequencies.

BRIEF DESCRIPTION OF THE DRAWINGS

These and other objects and advantages of the invention will be apparent upon reading the following description in conjunction with the drawings, in which:

FIG. 1 is a simplified schematic diagram of an RF mixer constructed in accordance with the invention;

FIG. 2 is an exploded view of a printed circuit partial transformer hybrid constructed in accordance with the invention;

FIG. 3 is an exploded view of a printed circuit transformer hybrid constructed in accordance with the invention;

FIG. 4 is a front view of the printed circuit transformer hybrid of FIG. 3;

FIG. 5 is a cross section taken along the line 5—5 of the transformer hybrid of FIG. 4; and FIG. 6 is a cross section taken along the line 6—6 of the transformer hybrid of FIG. 5.

DESCRIPTION OF THE PREFERRED EMBODIMENT

The term "transformer hybrid" appears for the device in FIG. 7.2 of "MICROWAVE MIXERS" by Stephan A. Mass, copyright 1860. The term "partial transformer hybrid" is used herein to describe a transformer hybrid without the third transformer winding.

Referring to FIG. 1, an RF mixer circuit 10 includes a symmetric amplifier 12 that drives the end terminals A,B of a partial transformer hybrid 14 consisting of a two layer printed coil that is divided into two halves 13 and 15. A center terminal tab C connects the junction of coil halves 13 and 15 to ground through a capacitor 16. A source of DC voltage +V is connected to terminal tab C. A transformer hybrid 26 with end terminal tabs D and E has a two layer printed coil that is divided into two halves 25 and 27 by a center terminal tab F. The transformer hybrid 26 may have the same type of coil construction as partial transformer hybrid 14, but includes an additional third layer with a printed coil having end terminal tabs G and H. It will be appreciated that transformer hybrid 26 incorporates a construction like that of partial transformer hybrid 14 with the addition of an added printed circuit IF pickup coil. The RF signal is supplied to the center terminal tab F of transformer hybrid 26 and the IF signal is taken from terminal tab G and grounded terminal tab H. As is well known, the symmetrical local oscillator (LO) signal from amplifier 12 causes ON/OFF commutation of the pairs of diodes 18,22 and 20,24.

The LO signal is not shunted by the "odd" mode high impedance of the partial transformer hybrid 14. The "even" mode RF signal is then coupled at terminals D, E to the diodes 18, 20, 22 and 24 on the upper side of the diode bridge and coupled to the AC ground by means of the partial transformer hybrid 14 on the lower side. Both partial transformer hybrid 14 and transformer hybrid 26 behave as short transmission lines (about 50–75 ohms characteristic impedance) for the RF signal propagating through partial transformer hybrid 14 and transformer hybrid 26 (even mode propagation).

In accordance with the invention, partial transformer hybrid 14 and transformer hybrid 26 of mixer 10 are of printed circuit construction. In FIG. 2, partial transformer hybrid 14 comprises coil halves 13a and 13b, and coil halves 15a and 15b, that are juxtaposed on opposite sides of an insulated substrate 30. In practice, the coil elements are conductive foils on both sides of a thin printed circuit board (substrate 30) and are interconnected via two "plated-through" holes 36, 46 and 38, 48 in respective ones of the two nested pads in the opposed ends of the coil elements. Even mode current flow proceeds via terminal A, through coil element 13a, plated-through hole 36, 46, coil element 13b to terminal tab C. Current flow in the other coil half proceeds via terminal tab B, through coil element 15a, plated-through hole 38, 48, coil element 15b to terminal tab C. The current flow is thus seen to be in opposite directions in the overlying coil elements and the transformer hybrid behaves therefore as a short (50–75 ohms) transmission line for the even mode signal propagation.

In FIG. 3, transformer hybrid 26 is indicated as including a substrate 40, with printed coil elements 25a, 25b, 27a and 27b, positioned in an arrangement similar to that for partial transformer hybrid 14 in FIG. 21, and a substrate 50 supporting printed IF pickup coil 28. Insulated substrate 50 supports IF coil 28 in juxtaposed, aligned position with respect to coil elements 25a, 27a and 25b, 27b. The insulated substrates 40 and 50 preferably comprise thin glass or Teflon filled printed circuit boards upon which the conductive foil elements are formed by conventional printed circuit techniques. In the finished transformer hybrid 26, coil elements 25a and 27a and 25b and 27b are formed on opposite sides of substrate 40 in juxtaposition to each other, and coil elements 28 is formed on the far side of substrate 50, which is cemented to substrate 40 to complete a "sandwich".

It will be noted that substrate 50 includes a small plated area 54 having a plated-through hole 66 that is in alignment with terminal tab F that has a plated-through hole 64. Thus plated area 54 is electrically connected to terminal tab F by means of plated-through holes 64, 66.

Referring to FIGS. 4, 5 and 6, substrates 40 and 50 are seen to be approximately square shaped and include small corner cutouts 31, 33 and 51, 53. These cutouts cooperate with a rectangular aperture 60 in a printed circuit board 56 to support the substrates and conductive elements in an orthogonal position so that conductive strips 58 on printed circuit board 56 may be electrically connected to the terminal tabs.

The conductive strips 58 and terminal tabs are electrically connected as indicated by the solder fillets 68 and 70 in FIG. 5. Those skilled in the art will readily appreciate that, in certain situations, it may be desirable to position conductive strips 58 on the other side of printed circuit board 56 and have the substrates 40 and 50 extend through the printed circuit board. Soldering to the various terminal tabs would then be accomplished on the lower side of the printed circuit board shown.

It will be appreciated that the thickness dimensions of the substrate and foil elements have been greatly exaggerated in FIGS. 4–6 to illustrate the construction details. In practice, the substrates are approximately 0.01 inches thick and the foil elements of even less thickness. The actual sizes of the elements if, of course, dependent upon design criteria for the devices and the frequency range involved. Manufacturing and installation techniques for components of these dimensions are well known. Suffice it to say that the labor and uncertainty of performance associated with prior art baluns and transformers operating at frequencies in the gigaHertz range are substantially eliminated with the invention.

What has been described is a novel printed circuit construction for high frequency partial transformer hybrids and transformer hybrids and for RF mixers utilizing such hybrids. It is recognized that numerous changes in the described embodiment of the invention will occur to those skilled in the art without departing from its true spirit and scope. The invention is to be limited only as defined in the claims.

What is claimed is:

1. In a wideband RF mixer of the type including symmetric inductive means having first second and third windings, means for coupling a symmetrical wideband RF signal to said first and second windings and means for deriving an IF signal from said third winding the improvement comprising:

said first and second windings comprising a first annular conductive element divided into first and second portions and a second annular split conductive element juxtaposed to said first element and separated therefrom by an insulating substrate, with said first and second portions being electrically interconnected with said second element;

a third annular continuous conductive element for said third winding; and an additional insulating substrate interposed between said second element and said third element.

2. The mixer of claim 1, further including:

a printed circuit board;

connection tabs on said elements for making electrical connections thereto;

a rectangular aperture in said printed circuit board for orthogonally supporting said substrates and said tabs; and conductors on said printed circuit board for making electrical connections with said tabs.

3. A wideband mixer comprises:

a hybrid transformer having first, second and third printed circuit windings;

said first and second windings comprising split annular conductive elements separated by a first substrate;

said third winding comprising a continuous annular element separated by a second substrate;

a partial hybrid transformer including fourth and fifth printed circuit windings comprising split annular conductive elements separated by a third substrate; and means for coupling a symmetrical wideband RF signal to said first and second and said fourth and fifth windings for deriving an IF signal from said third winding.

4. A high frequency hybrid comprising:

a first substantially circular metallic foil element divided into a first and a second portion;

a tab on one end of each of said first and second potions;

a pad on each of the other ends of said first and second portions;

a second substantially circular split metallic foil element juxtaposed to said first element and including pads on the open ends of said split element and a centrally located tab;

an insulating substrate interposed between and supporting said first and said second elements;

plated-through holes in said substrate and said pads electrically interconnecting said pads of said first and second elements;

a printed circuit board;

a rectangular aperture in said printed circuit board for orthogonally supporting said tabs and said substrate; and conductors on said printed circuit board for making electrical connection with said tabs.

5. The hybrid of claim 4, further including:

a third annular continuous conductive element having open ends;

a tab on each of said open ends; and an additional insulating substrate supporting said third element and interposed between said second element and said third element.

6. The hybrid of claim 5, further including:

a printed circuit board;

a substantially rectangular aperture in said printed circuit board for orthogonally supporting said tabs and said substrates; and conductors on said printed circuit board for making electrical connections with said tabs.

* * * * *